US008595891B2

(12) United States Patent
Okamoto et al.

(10) Patent No.: US 8,595,891 B2
(45) Date of Patent: Dec. 3, 2013

(54) DEVICE FOR REMOVING ADHERED SUBSTANCES

(75) Inventors: Yoshihiro Okamoto, Osaka (JP); Mitsuhiro Takeda, Osaka (JP); Takashi Kawamoto, Osaka (JP)

(73) Assignee: Sawa Corporation, Hirakata-shi (JP)

( * ) Notice: Subject to any disclaimer, the term of this patent is extended or adjusted under 35 U.S.C. 154(b) by 418 days.

(21) Appl. No.: 13/106,198

(22) Filed: May 12, 2011

(65) Prior Publication Data

US 2011/0277268 A1 Nov. 17, 2011

(30) Foreign Application Priority Data

May 13, 2010 (JP) .................................. 2010-110954

(51) Int. Cl.
*A47L 5/38* (2006.01)
(52) U.S. Cl.
USPC ............................................................ 15/302
(58) Field of Classification Search
USPC ............ 15/302, 303, 322, 415, 77, 88.3, 314
See application file for complete search history.

(56) References Cited

U.S. PATENT DOCUMENTS 4,281,431 A * 8/1981 Nierlich et al. ................. 15/1.51
6,199,243 B1 * 3/2001 Tani ................................. 15/302

FOREIGN PATENT DOCUMENTS

| JP | 2007-301809 A | 11/2007 |
| JP | 2009-291733 A | 12/2009 |

* cited by examiner

Primary Examiner — Robert Scruggs
(74) Attorney, Agent, or Firm — Oblon, Spivak, McClelland, Maier & Neustadt, L.L.P.

(57) ABSTRACT

A adhered substance removing device of the present disclosure includes a suction removal unit configured to suck and remove a liquid medium with which a wiping sheet is impregnated and adhered substances which is separated from the wiping sheet by an oscillation unit and re-adhered to a surface of the wiping sheet. The suction removal unit includes a cylindrical suction nozzle having inlet holes in a surface along which the wiping sheet is guided. and a suction pump configured to suck air from the suction nozzle. The Suction pump is connected to the suction nozzle, and a lid is detachably attached to an opening of the suction nozzle.

10 Claims, 7 Drawing Sheets

DEVICE FOR REMOVING ADHERED SUBSTANCES

CROSS-REFERENCE TO RELATED APPLICATION

This application claims priority to Japanese Patent Application No. 2010-110954 filed on May 13, 2010, the disclosure of which including the specification, the drawings, and the claims is hereby incorporated by reference in its entirety.

BACKGROUND

The present disclosure relates to a device for removing adhered substances.

Conventionally, a technique has been known, in which a metal mask is used to print cream solder or adhesive for bonding components on a printed circuit board. A metal plate such as stainless plates, nickel plates, etc is used as the metal mask. There is a possibility that, after, e.g., the cream solder is printed on the printed circuit board, the cream solder spreads over a surface of the metal mask, which faces the printed circuit board, and therefore a desired printing quality cannot be obtained.

Thus, for the metal mask used for the foregoing printing, after the solder is printed on the printed circuit board, the solder spreading over the surface of the metal mask, which faces the printed circuit board is wiped off with a non-woven fabric once every the predetermined number of times or every elapse of a predetermined time period as described in Japanese Patent Publication No. 2007-301809. In addition, in the device of Japanese Patent Publication No. 2007-301809, after the solder is wiped off, only one side of the non-woven fabric is soiled with the solder. Thus, the non-woven fabric is turned upside down, and then is rewound into a roll. In such a manner, both sides of the non-woven fabric can be used for wiping off the solder. This realizes great cost reduction as compared to a case where only one side of the non-woven fabric is used for wiping off the solder.

SUMMARY

However, in the conventional wiping device, after both sides of the wiping sheet are used for wiping off the solder, such a sheet is disposed. Thus, the wiping sheet is replaced by a new sheet, thereby increasing a cost. Further, since the solder is adhered to the used wiping sheet, such a sheet is disposed as industrial waste considering environment resistance, and therefore the disposal of the wiping sheet requires considerable care and time.

The present disclosure has been made in view of the foregoing, and it is an objective of the present disclosure to provide an adhered substance removing device in which adhered substances are removed from a wiping sheet used for wiping off the adhered substances such as solder, which spread over a surface of a metal mask, and the wiping sheet is reused several times.

The present disclosure is intended for a device for removing adhered substances from a long wiping sheet wounded into a roll after the wiping sheet is used for wiping off the adhere substances, and the solution to the problem is as follows.

That is, a first aspect of the present disclosure includes an upstream roller configured to rotatably support the wiping sheet wounded into the roll; a downstream roller configured to rewind the wiping sheet drawn from the upstream roller into a roll while delivering the wiping sheet to a downstream side in a delivery direction of the wiping sheet; a liquid supply unit arranged between the upstream and downstream rollers and configured to supply a liquid medium to the wiping sheet as an oscillation transmission medium; a storage tank configured to store the liquid medium supplied from the liquid supply unit; an oscillation unit arranged above the storage tank and including an ultrasonic oscillator providing oscillation to the liquid medium with which the wiping sheet is impregnated; and a suction removal unit arranged downstream the oscillation unit and configured to suck and remove the liquid medium with which the wiping sheet is impregnated and the adhered substances separated from the wiping sheet by the oscillation unit and re-adhered to a surface of the wiping sheet. The suction removal unit includes a cylindrical suction nozzle extending in a width direction of the wiping sheet and having an inlet hole in a surface along which the wiping sheet is guided, a lid detachably attached so as to close an opening at least one end of the suction nozzle, and a suction pump configured to suck air from the suction nozzle.

A second aspect of the present disclosure is intended for the device of the first aspect of the present disclosure, in which a plurality of slit-shaped inlet holes extending in an axial direction of the suction nozzle are formed so as to be spaced from each other in the axial direction, and the suction nozzle further includes a closing member configured to close the inlet hole opening in an outer position of the suction nozzle relative to an end of the wiping sheet guided along the suction nozzle in the width direction thereof.

A third aspect of the present disclosure is intended for the device of the first aspect of the present disclosure, a plurality of slit-shaped inlet holes extending in a circumferential direction of the suction nozzle so as to be inclined to the delivery direction of the wiping sheet are formed so as to be spaced from each other in the axial direction of the suction nozzle.

A fourth aspect of the present disclosure is intended for the device of the first aspect of the present disclosure, in which the suction nozzle further includes an outer nozzle cylinder having the inlet hole, and an inner nozzle cylinder rotatably fitted into the outer nozzle cylinder along an inner circumferential surface thereof, and, in the inner nozzle cylinder, a plurality of communication holes selectively opening/closing the inlet hole depending on a rotational angle of the inner nozzle cylinder are formed so as to be spaced from each other in a circumferential direction of the inner nozzle cylinder.

A fifth aspect of the present disclosure is intended for the device of the first aspect of the present disclosure, which further includes a heating unit configured to heat a surface of the suction nozzle, along which the wiping sheet is guided.

A sixth aspect of the present disclosure is intended for the device of the first aspect of the present disclosure, in which a bottom plate of the storage tank is downwardly inclined from an upstream side to a downstream side in the delivery direction of the wiping sheet.

A seventh aspect of the present disclosure is intended for the device of the first aspect of the present disclosure, in which a perforated metal is arranged so as to face the bottom plate of the storage tank with a predetermined clearance in the storage tank.

An eighth aspect of the present disclosure is intended for the device of the first aspect of the present disclosure, which further includes a position adjustment roller arranged between the oscillation unit and the suction removal unit and configured to adjust a height of the wiping sheet relative to the oscillation unit. The oscillation unit and the position adjustment roller are movable in synchronization with each other between a position in which the oscillation unit faces the storage tank and a position in which the oscillation unit is apart from the storage tank.

A ninth aspect of the present disclosure is intended for the device of the first aspect of the present disclosure, which further includes a rotation restriction unit configured to restrict rotation of the upstream roller after winding of the wiping sheet around the downstream roller is started and before predetermined tensile force is provided to the wiping sheet stretched between the upstream roller and the downstream roller.

A tenth aspect of the present disclosure is intended for the device of the first aspect of the present disclosure, in which the oscillation unit includes a plurality of ultrasonic oscillators, and each of the plurality of ultrasonic oscillators is independently switchable between an operated state and a stopped state.

According to the first aspect of the present disclosure, the wiping sheet wounded into the roll is drawn and delivered toward the downstream side in the delivery direction of the wiping sheet, the liquid medium is supplied to the wiping sheet in the liquid supply unit, and the oscillation of the ultrasonic oscillators is transmitted to the wiping sheet and the adhered substances through the liquid medium with which the wiping sheet is impregnated. Thus, the adhered substances adhered to the wiping sheet can be separated by amplitude variation caused due to a transmission velocity difference between the oscillation transmitted to the wiping sheet and the oscillation transmitted to the adhered substances. As a result, the wiping sheet used for wiping off the adhered substances can be reused several times. In addition, it is not necessary to dispose the wiping sheet, and therefore the reuse of the wiping sheet is advantageous to the cost reduction.

By repeating the separation of the adhered substances several times, the adhered substances such as solder are not adhered to the wiping sheet even if fibers of the wiping sheet are deteriorated and the wiping sheet cannot be reused. Thus, it is not necessary to dispose the wiping sheet as industrial waste, thereby reducing an environment load.

For example, if the present disclosure is employed for a wiping sheet used for wiping off a silver paste instead of solder, a silver component separated from the wiping sheet is collected, and therefore not only the wiping sheet but also the silver component can be reused.

Since the suction removal unit is provided downstream the oscillation unit, the liquid medium with which the wiping sheet is impregnated can be absorbed and dried for a short period of time after the adhered substances are separated from the wiping sheet. In addition, the adhered substances re-adhered to the surface of the wiping sheet during the delivery thereof can be sucked and removed after the adhered substances are separated from the wiping sheet. Consequently, the drying of the wiping sheet and the removal of the adhered substances can be simultaneously performed.

If the wiping sheet is wounded in the roll in a state in which there is lint on the surface of the wiping sheet, there is a possibility that the thickness of the roll becomes non-uniform such as a case where the thickness of the roll is increased in a portion having the lint. However, in the present disclosure, even if there is lint on the surface of the wiping sheet, the lint is pulled out, sucked, and removed by the suction removal unit, and therefore the foregoing problem is solved.

The opening is provided at the at least one end of the suction nozzle of the suction removal unit, and the lid closing the opening is detachably attached. Thus, cleaning of an inside of the suction nozzle is facilitated.

Specifically, the adhered substances re-adhered to the surface of the wiping sheet and fibers of the wiping sheet are sucked into the suction removal unit in addition to the liquid medium. Thus, there is a possibility that the adhered substances and the fibers accumulated in the suction nozzle narrow an airflow path of the suction nozzle, resulting in degradation of suction efficiency.

On the other hand, in the present disclosure, since the lid is detachably attached to the opening of the suction nozzle, the operator can detach the lid to regularly check whether or not the suction nozzle is clogged with the adhered substances and the fibers, and the adhered substances and the fibers can be easily removed by using, e.g., a long brush.

According to the second aspect of the present disclosure, since the plurality of slit-shaped inlet holes extending in the axial direction of the suction nozzle are provided so as to be spaced from each other in the axial direction, adequate stiffness of the suction nozzle can be ensured as compared to a case where a single slit-shaped inlet hole is provided across the length of the suction nozzle in the axial direction thereof, and the liquid medium can be efficiently sucked and removed across a wide area of the wiping sheet in the width direction thereof.

The inlet hole opening in the outer position of the suction nozzle relative to the end of the wiping sheet guided along the suction nozzle in the width direction thereof, i.e., the inlet hole which does not contribute to the suction and removal of the liquid medium is closed by the closing member. Thus, the suction efficiency can be improved.

According to the third aspect of the present disclosure, the plurality of slit-shaped inlet holes extending in the circumferential direction of the suction nozzle so as to be inclined to the delivery direction of the wiping sheet are formed so as to be spaced from each other in the axial direction of the suction nozzle. Thus, the liquid medium can be efficiently sucked and removed.

According to the fourth aspect of the present disclosure, the inner nozzle cylinder rotates, and the communication holes of the inner nozzle cylinder and the inlet holes of the outer nozzle cylinder are selectively communicated with each other, thereby opening/closing the selected inlet holes. Thus, the inlet holes which do not contribute to the suction and removal of the liquid medium can be closed depending on the width of the wiping sheet, thereby improving the suction efficiency.

After fibers of the wiping sheet are sucked, even if some fibers are caught at a rim of the inlet hole, the fibers can be easily removed by rotating the inner nozzle cylinder.

According to the fifth aspect of the present disclosure, the heating unit heats the surface of the suction nozzle, along which the wiping sheet is guided. Thus, the suction nozzle sucks and removes the liquid medium, and functions as a so-called "smoothing iron" to smooth the wiping sheet with heat by pressing the surface of the wiping sheet against the heated surface of the suction nozzle. As a result, drying of the liquid medium can be accelerated, and lint on the surface of the wiping sheet can be removed.

According to the sixth aspect of the present disclosure, the bottom plate of the storage tank is downwardly inclined from the upstream side to the downstream side in the delivery direction of the wiping sheet, and therefore the adhered substances separated from the wiping sheet are accumulated on the downstream side in the delivery direction of the wiping sheet along the bottom plate of the storage tank. This is advantageous to reduction of the re-adhering of the adhered substances to the surface of the wiping sheet during the delivery thereof.

According to the seventh aspect of the present disclosure, the perforated metal is arranged so as to face the bottom plate of the storage tank with the predetermined clearance. This is advantageous to the reduction of the re-adhering of the adhered substances separated from the wiping sheet to the surface of the wiping sheet during the delivery thereof.

Specifically, if the perforated metal is not arranged in the storage tank, the adhered substances separated from the wiping sheet are accumulated on the bottom plate of the storage tank. However, there is a possibility that the surface of the wiping sheet contacts the bottom plate of the storage tank during the delivery of the wiping sheet, and the adhered substances accumulated on the bottom plate of the storage tank are re-adhered to the surface of the wiping sheet.

On the other hand, in the present disclosure, a part of the adhered substances separated from the wiping sheet is accumulated on the bottom plate of the storage tank through the holes of the perforated metal. The remaining adhered substances are accumulated on an upper surface of the perforated metal. When the oscillation of the oscillation unit is transmitted to the perforated metal through the liquid medium, the adhered substances accumulated on the upper surface of the perforated metal are oscillated. The adhered substances drop through the holes of the perforated metal, and are accumulated on the bottom plate of the storage tank. Thus, few adhered substances are accumulated on the upper surface of the perforated metal. As a result, even if the surface of the wiping sheet contacts the upper surface of the perforated metal during the delivery of the wiping sheet, the re-adhering of the adhered substances to the wiping sheet can be reduced.

According to the eighth aspect of the present disclosure, the oscillation unit and the position adjustment roller are movable in synchronization with each other between the position in which the oscillation unit faces the storage tank and the position in which the oscillation unit is apart from the storage tank. Thus, the oscillation unit is upwardly moved so as to be apart from the storage tank, thereby facilitating an operation in which the wiping sheet is drawn from the upstream roller and is wounded around the downstream roller, and an operation in which the wiping sheet is detached from the adhered substance removing device during the delivery the wiping sheet. In addition, when the oscillation unit faces the storage tank, it is not necessary to readjust the position adjustment roller, thereby improving working efficiency.

According to the ninth aspect of the invention, a rotation restriction unit restricts the rotation of the upstream roller after the winding of the wiping sheet around the downstream roller is started and before the predetermined tensile force is provided to the wiping sheet stretched between the upstream roller and the downstream roller. Thus, disadvantages can be avoided, in which, when starting the delivery of the wiping sheet in a state in which the wiping sheet is loosened, the wiping sheet is entangled during the delivery thereof, and the sufficient oscillation of the oscillation unit is not transmitted to the wiping sheet and the adhered substances.

According to the tenth aspect of the invention, each of the plurality of ultrasonic oscillators is independently switchable between the operated state and the stopped state. Thus, e.g., when the wiping sheet to which few the adhered substances are adhered is delivered, an operation of some of the ultrasonic oscillators is stopped, and the remaining ultrasonic oscillators perform an operation for removing the adhered substances. Thus, power used for driving the ultrasonic oscillators can be saved, and such power saving is advantageous to reduction in power consumption.

When driving of the ultrasonic oscillators is continued for a long period of time, and the temperature of the oscillation unit is risen, the operation of some of the ultrasonic oscillators is stopped in order to reduce or prevent damage due to heat from the ultrasonic oscillators, thereby reducing a further rise in temperature. This is advantageous to extension of a life of the ultrasonic oscillator. In addition, when the temperature is sharply risen, a control such as stopping of all of the ultrasonic oscillators for several minutes may be performed, thereby reducing the damage due to heat from the ultrasonic oscillators.

DETAILED DESCRIPTION

An embodiment of the present disclosure will be described below with reference to the drawings. The embodiment described below will be set forth merely for purposes of preferred examples in nature, and are not intended to limit applications or use of the present disclosure.

Figure 1:
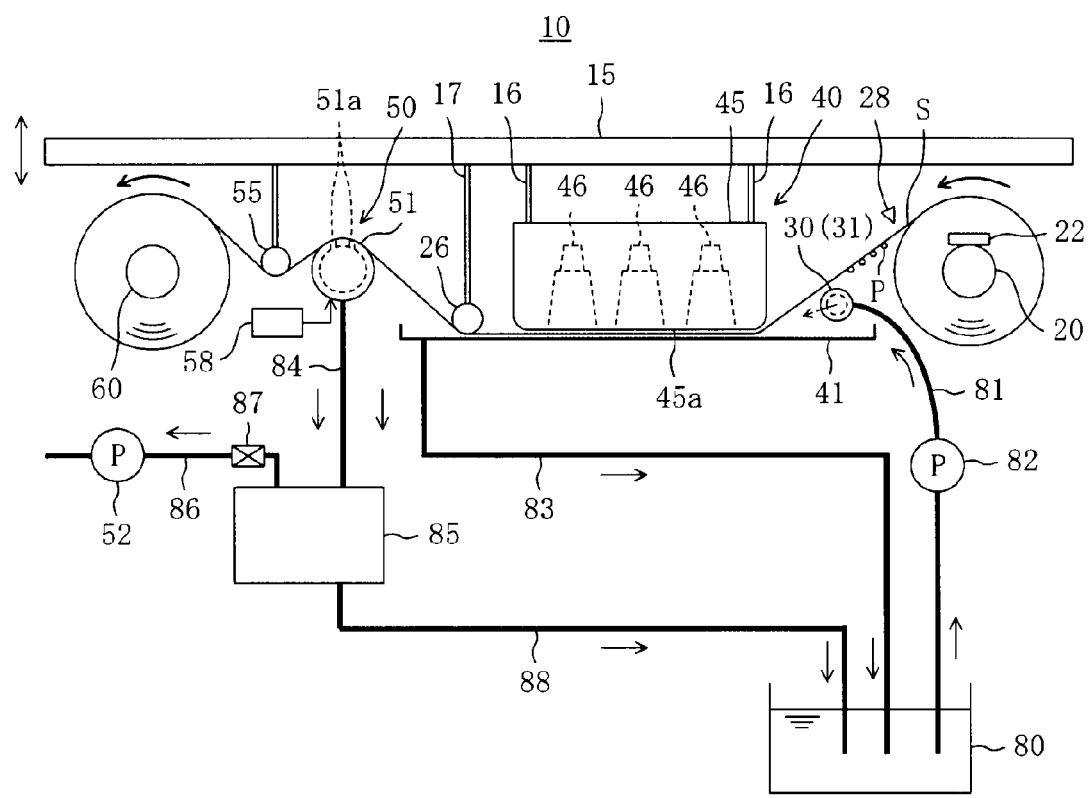
FIG. 1 is a front view illustrating a configuration of an adhered substance removing device of an example embodiment of the present disclosure.
Figure 2:
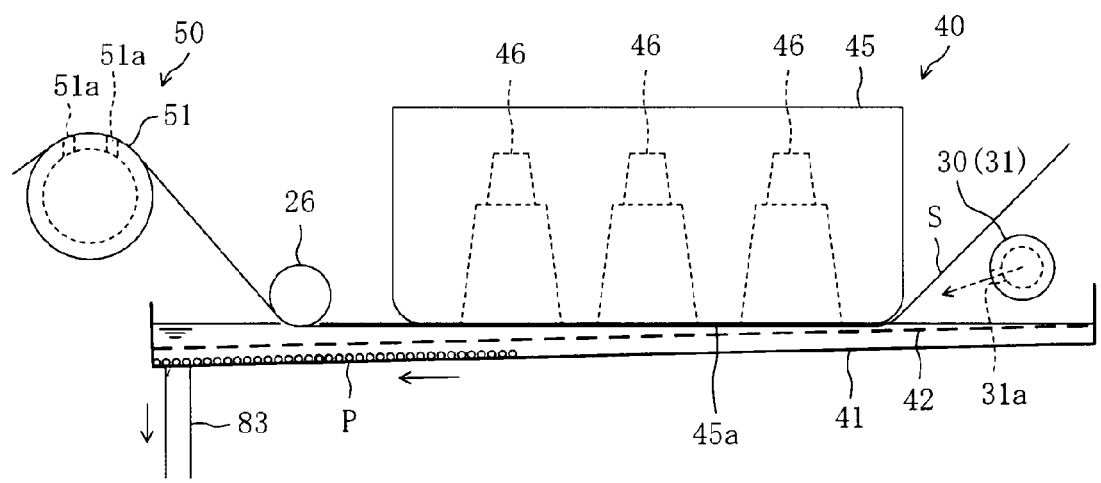
FIG. 2 is an enlarged front view illustrating a part of the configuration of the adhered substance removing device around an oscillation unit.

FIG. 1 is a front view illustrating a configuration of an adhered substance removing device of the example embodiment of the present disclosure, and FIG. 2 is an enlarged front view illustrating a part of the configuration of the adhered substance removing device around an oscillation unit. As illustrated in FIGS. 1 and 2, an adhered substance removing device 10 is configured to remove an adhered substance P from a wiping sheet S used for wiping off the adhered substance P.

Specifically, when a metal mask is used to print cream solder on a printed circuit board, the wiping sheet S is used for wiping off the adhered substance P, i.e., cream solder spreading over a surface of the metal mask, which faces the printed circuit board. Note that, in the present example embodiment, a non-woven fabric is used as the wiping sheet S, but a woven fabric sheet made by weaving fibers may be used.

The adhered substance removing device 10 includes an upstream roller 20 rotatably supporting the long wiping sheet S which is used for wiping off the adhered substance P, and than is wounded into a roll so that a surface of the wiping sheet S, to which the adhered substance P is adhered faces an inside of the roll; a downstream roller 60 configured to rewind the wiping sheet S drawn from the upstream roller 20 into a roll while delivering the wiping sheet S toward a downstream side in a delivery direction of the wiping sheet S; a liquid supply unit 30 arranged between the upstream roller 20 and the downstream roller 60 and configured to supply a liquid medium to the wiping sheet S as an oscillation transmission medium; an oscillation unit 40 configured to provide oscillation to the wiping sheet S and the adhered substance P through the liquid medium; and a suction removal unit 50 configured to suck and remove the liquid medium with which the wiping sheet S is impregnated. Such units are covered by a main body cover 15. The main body cover 15 is opened/closed by rotating about a center shaft which is not shown in the figure.

The upstream roller 20 serves as a so-called "driven roller" rotating in conjunction with rotation of the downstream roller 60, and is rotatably supported by bearing members 70 (see FIG. 13) which will be described later at both ends of a roller shaft thereof. Note that the upstream roller 20 may be rotatably driven by a drive motor which is not shown in the figure.

The upstream roller 20 is detachable from the bearing members 70 in a state in which the used wiping sheet S is wounded in the roll. More specifically, the wiping sheet S is wounded around a cylindrical core, and an inner portion of the cylindrical core is fitted onto the roller shaft of the upstream roller 20 so that the roll of the wiping sheet S can be attached to the upstream roller 20. Since a configuration of the bearing member 70 detachably supporting the upstream roller 20 is similar to that of a bearing member 70 rotatably supporting the downstream roller 60, the configuration of the bearing member 70 will be described later.

A roll inner end detection sensor 28 is provided near downstream of the upstream roller 20. The roll inner end detection sensor 28 is configured to detect that an inner end of the roll of the wiping sheet S wounded around the upstream roller 20 is detached from the upstream roller 20.

An upper surface of the roller shaft of the upstream roller 20 is pressed by a rotation restriction member 22. The rotation restriction member 22 is, e.g., an elastically-deformable member, and restricts rotation of the upstream roller 20 by contacting the roller shaft of the upstream roller 20 in a state in which the rotation restriction member 22 is elastically deformed. The rotation restriction member 22 is attached to the main body cover 15, and presses the roller shaft of the upstream roller 20 in conjunction with opening/closing of the main body cover 15.

When predetermined tensile force is provided to the wiping sheet S between the upstream roller 20 and the downstream roller 60 while winding the wiping sheet S around the downstream roller 60, the pressing of the wiping sheet S by the rotation restriction member 22 is canceled, and the rotation of the upstream roller 20 is allowed.

In such a configuration, disadvantages can be avoided, in which, when starting the delivery of the wiping sheet S in a state in which the wiping sheet S is loosened, the wiping sheet S is entangled during the delivery, and the sufficient oscillation of the oscillation unit 40 is not transmitted to the wiping sheet S and the adhered substance P.

The wiping sheet S drawn from the upstream roller 20 passes above a supply pipe 31 of the liquid supply unit 30 arranged on the downstream side in the delivery direction of the wiping sheet S, and is guided along a curved surface of a lower portion of the oscillation unit 40 on an upstream side in the delivery direction of the wiping sheet S. Then, the wiping sheet S is upwardly guided from below a position adjustment roller 26 arranged downstream the oscillation unit 40 along an outer circumferential surface thereof.

The liquid supply unit 30 includes the supply pipe 31 extending in a width direction of the wiping sheet S. In the supply pipe 31, a plurality of injection holes 31a are formed so as to be spaced from each other in an axial direction of the supply pipe 31. Specifically, in order to inject the liquid medium which is the oscillation transmission medium to the wiping sheet S delivered from the supply pipe 31 to the oscillation unit 40, the injection hole 31a is formed so as to extend obliquely downward in the supply pipe 31. Note that, in the present example embodiment, alcohol is used as the liquid medium.

The liquid medium is supplied from a storage tank 80 storing the liquid medium to the liquid supply unit 30. Specifically, a supply pipe 81 is provided between the liquid supply unit 30 and the storage tank 80, and a supply pump 82 is connected to the supply pipe 81. The supply pump 82 is driven to draw the liquid medium in the storage tank 80, thereby supplying the liquid medium to the liquid supply unit 30 through the supply pipe 81.

In addition to the supply pipe 81 connected to the liquid supply unit 30, a collection pipe 83 which is connected to a bottom plate of a storage tank 41 (described later) so as to be communicated with the storage tank 41, and a separation pipe 88 which is connected to a bottom plate of a separation tank 85 (described later) so as to be communicated with the separation tank 85 are connected to the storage tank 80. The liquid medium collected through the collection pipe 83 and the separation pipe 88 is stored in the storage tank 80, and is reused and supplied to the liquid supply unit 30. This reduces the number of operational steps at which an operator checks an amount of the liquid medium discharged from the storage tank 80 and refills the storage tank 80 with the liquid medium, thereby improving workability. In addition, the reuse of the liquid medium is advantageous to cost reduction.

The oscillation unit 40 is arranged above the storage tank 41 storing the liquid medium supplied from the liquid supply unit 30, and includes a diaphragm 45a through which oscillation is provided to the liquid medium with which the wiping sheet S is impregnated and ultrasonic oscillators 46 attached to an upper surface of the diaphragm 45a.

The storage tank 41 stores the liquid medium supplied from the liquid supply unit 30. More specifically, the storage tank 41 receives and stores the liquid medium which is not absorbed by the wiping sheet S and is leaked from the surface of the wiping sheet S while impregnating the wiping sheet S with the liquid medium.

The bottom plate of the storage tank 41 is downwardly inclined from the upstream side to the downstream side in the delivery direction of the wiping sheet S. Thus, the adhered substance P separated from the wiping sheet S is accumulated on the downstream side in the delivery direction of the wiping sheet S along the inclined bottom plate of the storage tank 41, thereby reducing re-adhering of the adhered substance P to the surface of the wiping sheet S during the delivery thereof.

A perforated metal 42 is arranged so as to face the bottom plate of the storage tank 41 with a predetermined clearance in the storage tank 41. Specifically, spacers which are not shown in the figure are provided between the storage tank 41 and the perforated metal 42, and the predetermined clearance is formed between the bottom plate of the storage tank 41 and the perforated metal 42. Note that both ends of the perforated metal 42 in a width direction or a longitudinal direction thereof may be downwardly bent, such bent portions may be used as the spacers.

The collection pipe 83 through which the liquid medium in the storage tank 41 is collected is connected to a portion of the bottom plate of the storage tank 41 on the downstream side in the delivery direction of the wiping sheet S. An outlet end of the collection pipe 83 is connected to the storage tank 80, and the liquid medium stored in the storage tank 41 is discharged to the storage tank 80 through the collection pipe 83.

The diaphragm 45a serves as a bottom plate of a hollow oscillation box 45 arranged above the storage tank 41. A lower portion of the oscillation box 45 on the upstream side in the delivery direction of the wiping sheet S defines a curved surface along which the wiping sheet S is guided. A plurality of ultrasonic oscillators 46 are arranged in the oscillation box 45. Note that arrangement of the ultrasonic oscillators 46 is set as necessary so that the oscillation can be uniformly transmitted across the entire surface of the wiping sheet S in the width direction thereof.

The oscillation box 45 is attached to the main body cover 15 through position adjustment mechanisms 16, and the height of the diaphragm 45a can be adjusted. Similarly, the position adjustment roller 26 is also attached to the main body cover 15 through position adjustment mechanisms 17. In such a state, the wiping sheet S is guided along the curved surface of the oscillation box 45 and comes into contact with the diaphragm 45a. Then, the oscillation is transmitted to the wiping sheet S through the liquid medium with which the wiping sheet S is impregnated. Note that the height of the position adjustment roller 26 may be adjusted so that the liquid medium with which the wiping sheet S is impregnated and which is present as a film on the surface of the wiping sheet S comes into contact with the diaphragm 45a.

As in the foregoing, the attachment of the oscillation box 45 and the position adjustment roller 26 to the main body cover 15 allows the oscillation box 45 and the position adjustment roller 26 to move in synchronization with each other between a position in which the oscillation box 45 faces the storage tank 41 and a position in which the oscillation box 45 is apart from the storage tank 41 in conjunction with the opening/closing of the main body cover 15. Thus, the oscillation box 45 is upwardly moved so as to be apart from the storage tank 41, thereby facilitating an operation in which the wiping sheet S is drawn from the upstream roller 20 and is wounded around the downstream roller 60, and an operation in which the wiping sheet S is detached from the adhered substance removing device 10 in the middle of the delivery thereof. In addition, when the oscillation box 45 faces the storage tank 41, it is not necessary to readjust the position adjustment roller 26, thereby improving working efficiency.

Each of the plurality of ultrasonic oscillators 46 is independently switchable between an operated state and a stopped state. For example, when the wiping sheet S to which few particles of the adhered substance P are adhered is delivered, an operation of some of the ultrasonic oscillators 46 is stopped, and the remaining ultrasonic oscillators 46 perform an operation for removing the adhered substance P. Thus, power used for driving the ultrasonic oscillators 46 can be saved, and such power saving is advantageous to reduction in power consumption.

When the driving of the ultrasonic oscillators 46 is continued for a long period of time, and the temperature of the oscillation unit 40 is risen, the operation of some of the ultrasonic oscillators 46 is stopped in order to reduce or prevent damage due to heat from the ultrasonic oscillators 46, thereby reducing a further rise in temperature. In addition, when the temperature is sharply risen, a control such as stopping of all of the ultrasonic oscillators 46 for several minutes may be performed, thereby reducing the damage due to heat from the ultrasonic oscillators 46.

The ultrasonic oscillator 46 is operated to oscillate the diaphragm 45a in a thickness direction thereof. The oscillation generated by the ultrasonic oscillator 46 generates longitudinal oscillatory waves, and such waves are transmitted to the wiping sheet S and the adhered substance P through the liquid medium with which the wiping sheet S is impregnated.

In such a state, amplitude variation is caused due to a transmission velocity difference between the oscillation transmitted to the wiping sheet S and the oscillation transmitted to the adhered substance P because of a difference in material of the wiping sheet S and the adhered substance P. That is, the transmission velocity of the oscillation transmitted to the adhered substance P which metal material such as solder is higher than that of the oscillation transmitted to the wiping sheet S which is the non-woven fabric, and therefore the ultrasonic oscillation transmitted to the adhered substance P has a greater amplitude. The amplitude variation separates the adhered substance P from the wiping sheet S.

In such a manner, only by providing the ultrasonic oscillation to the adhered substance P adhered to the wiping sheet S, the adhered substance P can be separated from the surface of the wiping sheet S, and therefore the wiping sheet S can be reused.

Energy of the oscillation passing through the liquid medium from the ultrasonic oscillators 46 is reflected on the perforated metal 42, thereby reducing attenuation of the oscillation energy. Thus, the ultrasonic oscillation can be efficiently provided to the adhered substance P. The perforated metal 42 may be made of, e.g., stainless.

A part of the particles of the adhered substance P separated from the wiping sheet S is accumulated on the bottom plate of the storage tank 41 through holes of the perforated metal 42. The remaining particles of the adhered substance P separated from the wiping sheet S are accumulated on an upper surface of the perforated metal 42. However, since the perforated metal 42 reflects the oscillation of the ultrasonic oscillators 46 and oscillates, such oscillation allows the remaining particles of the adhered substance P to drop through the holes of the perforated metal 42 and be accumulated on the bottom plate of the storage tank 41.

Such a configuration is advantageous to the reduction of the re-adhering of the adhered substance P separated from the wiping sheet S to the surface of the wiping sheet S during the delivery thereof. Specifically, if the perforated metal 42 is not arranged in the storage tank 41, the adhered substance P separated from the wiping sheet S is accumulated on the bottom plate of the storage tank 41. However, there is a possibility that the surface of the wiping sheet S contacts the bottom plate of the storage tank 41 during the delivery of the wiping sheet S, and the adhered substance P accumulated on the bottom plate of the storage tank 41 is re-adhered to the surface of the wiping sheet S.

On the other hand, in the present example embodiment, the adhered substance P separated from the wiping sheet S is accumulated on the bottom plate of the storage tank 41 through the holes of the perforated metal 42, and therefore few particles of the adhered substance P is accumulated on the upper surface of the perforated metal 42. Consequently, even if the surface of the wiping sheet S contacts the upper surface of the perforated metal 42 during the delivery of the wiping sheet S, the re-adhering of the adhered substance P to the wiping sheet S can be reduced.

The wiping sheet S from which the adhered substance P is removed in the oscillation unit 40 is upwardly guided from below the position adjustment roller 26 along the outer circumferential surface thereof, and then is downwardly guided from above a suction nozzle 51 of the suction removal unit 50 along an outer circumferential surface thereof. The suction removal unit 50 is configured to suck and remove the liquid medium with which the wiping sheet S is impregnated, and the adhered substance P separated from the wiping sheet S in the oscillation unit 40 and then re-adhered to the surface of the wiping sheet S during the delivery thereof. Note that, if there is lint on the surface of the wiping sheet S, the lint is pulled out, sucked, and removed.

Figure 3:
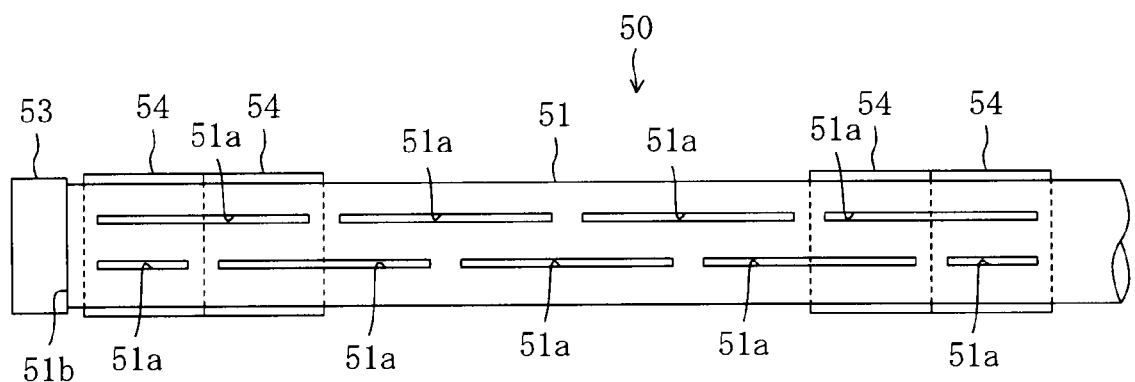
FIG. 3 is a plan view illustrating a configuration of a suction nozzle.
Figure 4:
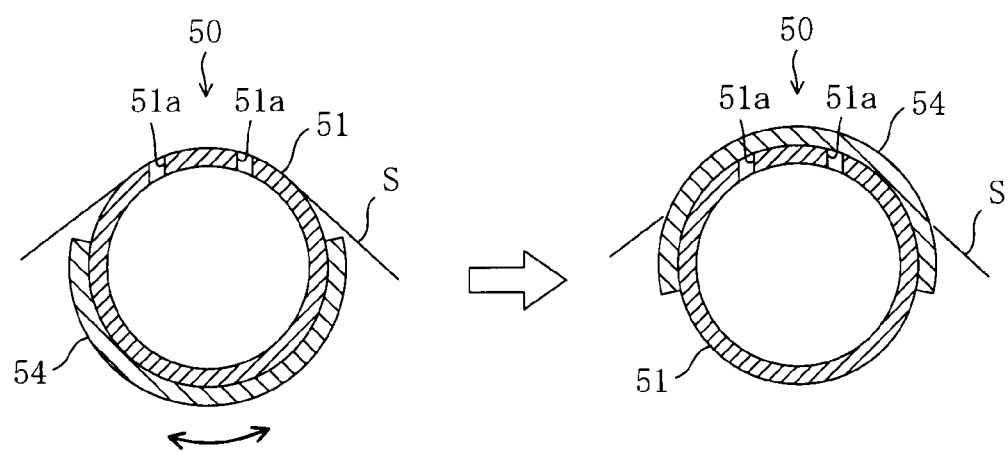
FIG. 4 is a cross-sectional view illustrating the configuration of the suction nozzle.

FIG. 3 is a plan view illustrating a configuration of the suction removal unit, and FIG. 4 is a cross-sectional view thereof. As illustrated in FIGS. 3 and 4, the suction removal unit 50 includes the cylindrical suction nozzle 51 extending in the width direction of the wiping sheet S, and a suction pump 52 (see FIG. 1) configured to suck air in the suction nozzle 51. Slit-shaped inlet holes 51a extending in the axial direction of the suction nozzle 51 open in an upper portion of the outer circumferential surface of the suction nozzle 51, i.e., in a surface portion along which the wiping sheet S is guided. A plurality of inlet holes 51a are provided so as to be spaced from each other in the axial direction of the suction nozzle 51. Such a configuration ensures adequate stiffness of the suction nozzle 51 as compared to a case where a single slit-shaped inlet hole 51a is provided across the length of the suction nozzle 51 in the axial direction thereof, and allows efficient suction and removal of the liquid medium across a wide area of the wiping sheet S in the width direction thereof.

Rows each including the inlet holes 51a arranged in the axial direction of the suction nozzle 51 are provided so as to be spaced from each other in a circumferential direction of the suction nozzle 51. In FIG. 3, an upper row of the inlet holes 51a and a lower row of the inlet holes 51a are arranged in a so-called "zigzag pattern," i.e., in a pattern in which the upper and lower rows are displaced relative to each other in the axial direction of the suction nozzle 51 so that a joint portion between the inlet holes 51a of the upper row does not continue to a joint portion between the inlet holes 51a of the lower row in the circumferential direction of the suction nozzle 51.

As illustrated in FIG. 1, the suction nozzle 51 is connected to the hollow separation tank 85 through a suction pipe 84. A discharge duct 86 is connected to an upper surface of the separation tank 85, and the separation pipe 88 is connected to a bottom surface of the separation tank 85. The suction pump 52 is connected to the discharge duct 86. The suction pump 52 sucks air in the separation tank 85 through the discharge duct 86, and therefore the separation tank 85 is under negative pressure. As a result, air in the suction nozzle 51 is sucked through the suction pipe 84, and the liquid medium and the adhered substance P are sucked and removed through the inlet holes 51a.

As illustrated in FIGS. 3 and 4, a lid 53 configured to close an opening 51b opening at a left end of the suction nozzle 51 is detachably attached to the opening 51b. This facilitates cleaning of an inside of the suction nozzle 51.

Specifically, the adhered substance P re-adhered to the surface of the wiping sheet S and fibers of the wiping sheet S are sucked into the suction nozzle 51 in addition to the liquid medium. Thus, there is a possibility that the adhered substance P and fibers accumulated in the suction nozzle 51 narrow an airflow path of the suction nozzle 51, resulting in degradation of suction efficiency.

On the other hand, in the present example embodiment, since the lid 53 is detachably attached to the opening 51b of the suction nozzle 51, the operator can detach the lid 53 to regularly check whether or not the suction nozzle 51 is clogged with the adhered substance P and fibers, and the adhered substance P and fibers can be easily removed by using, e.g., a long brush.

Closing members 54 which can open/close the inlet holes 51a are provided in both end portions of the suction nozzle 51 in the axial direction thereof. The closing member 54 is an arc-like member having a U-shaped cross section, and is slidably fitted onto the suction nozzle 51 along the outer circumferential surface thereof. As illustrated in FIG. 4, when the closing member 54 is positioned below the suction nozzle 51, the inlet holes 51a are opened. On the other hand, when the closing member 54 slides along the outer circumferential surface of the suction nozzle 51 and is positioned above the suction nozzle 51, the inlet holes 51a are closed.

Figure 5:
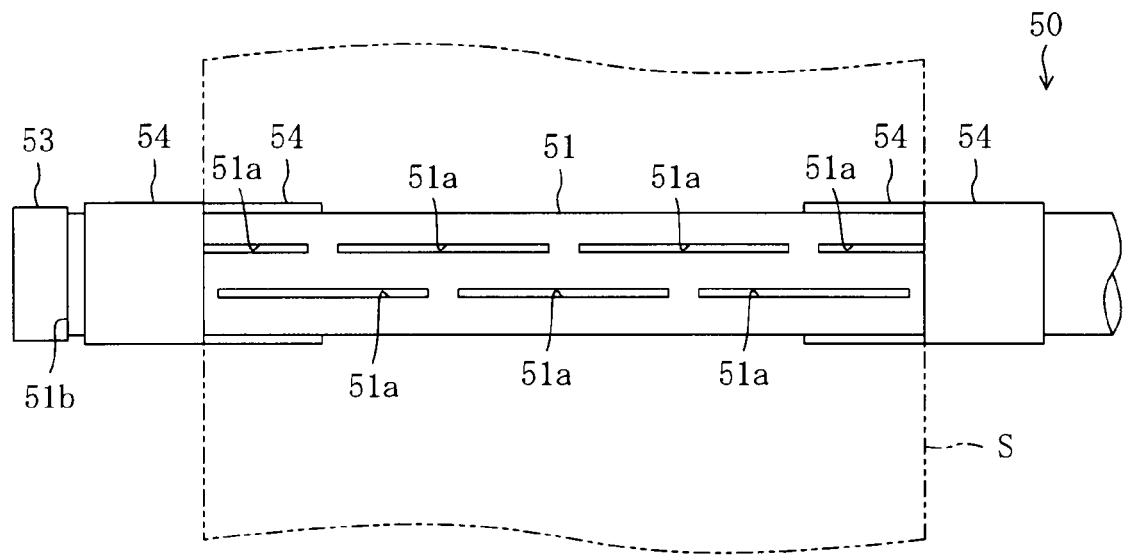
FIG. 5 is a plan view illustrating positions where inlet holes are closed corresponding to a wide wiping sheet.
Figure 6:
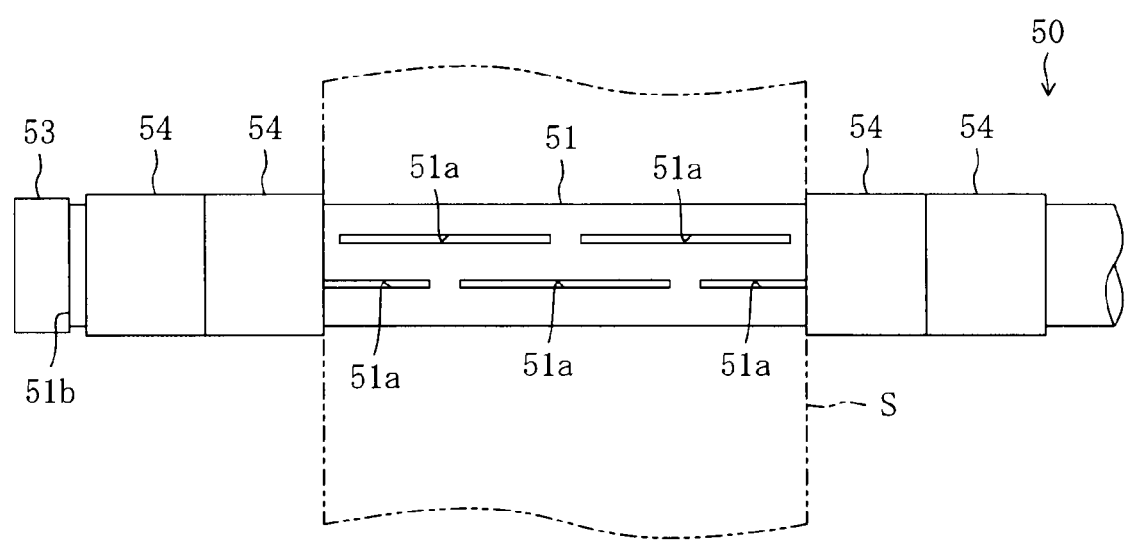
FIG. 6 is a plan view illustrating positions where the inlet holes are closed corresponding to a narrow wiping sheet.

As illustrated in FIG. 5, when the liquid medium is sucked from the wide wiping sheet S, two closing members 54 arranged at both ends of the suction nozzle 51 in the axial direction thereof close the inlet holes 51a opening in outer positions of the suction nozzle 51 relative to both ends of the wiping sheet S in the width direction thereof. As illustrated in FIG. 6, when the liquid medium is sucked from the narrow wiping sheet S, all of the closing members 54 close the inlet holes 51a opening in outer positions of the suction nozzle 51 relative to both ends of the wiping sheet S in the width direction thereof. In such a manner, the inlet holes 51a which are not contribute to the suction and removal of the liquid medium are closed by the closing members 54, thereby improving the suction efficiency.

Note that the number, shape, and arrangement of the closing members 54 have been set forth merely for purposes of examples in nature, and the present disclosure is not limited to such a configuration. In addition, the closing member 54 may be detachable from the suction nozzle 51.

Figure 7:
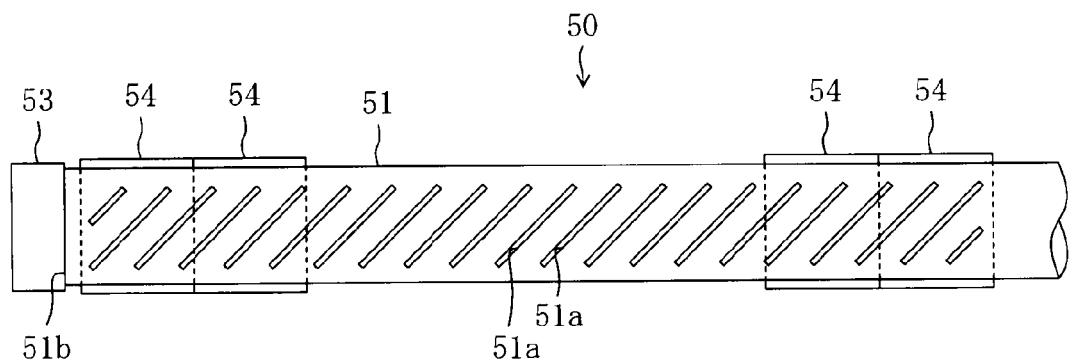
FIG. 7 is a plan view illustrating a configuration in which the inlet holes of the suction nozzle are inclined to a delivery direction of a wiping sheet.

In the present example embodiment, the inlet hole 51a of the suction nozzle 51 is in the slit-like shape extending in the axial direction of the suction nozzle 51, but the present disclosure is not limited to such a configuration. As illustrated in, e.g., FIG. 7, a plurality of slit-shaped inlet holes 51a extending in the circumferential direction of the suction nozzle 51 so as to be inclined to the delivery direction of the wiping sheet S may be formed so as to be spaced from each other in the axial direction of the suction nozzle 51.

Figure 8:
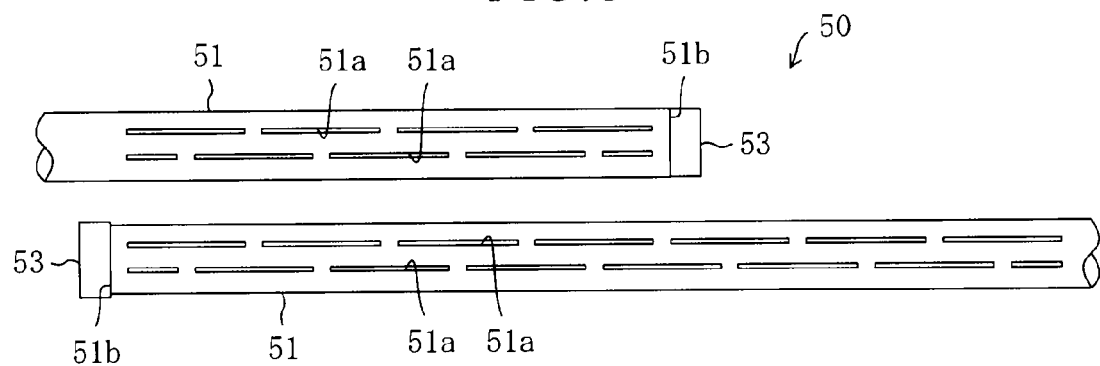
FIG. 8 is a plan view illustrating a configuration in which two suction nozzles are arranged in the delivery direction of the wiping sheet.

Alternatively, as illustrated in FIG. 8, two suction nozzles 51 may be arranged in the delivery direction of the wiping sheet S. In such a case, an upper suction nozzle 51 may suck air through a left end thereof, and a lower suction nozzle 51 may suck air through a right end thereof. Specifically, when the length of the suction nozzle 51 is long, it is likely that suction power of the suction nozzle 51 near the lid 53 is lower than that near the suction pipe 84, resulting in a lack of a suction amount. On the other hand, when the two suction nozzles 51 are arranged in the delivery direction of the wiping sheet S as illustrated in FIG. 8, even if the lower suction nozzle 51 lacks the suction power near the lid 53, the upper suction nozzle 51 can compensate for the suction power, and therefore non-uniform suction power against the wiping sheet S can be reduced.

Figure 9:
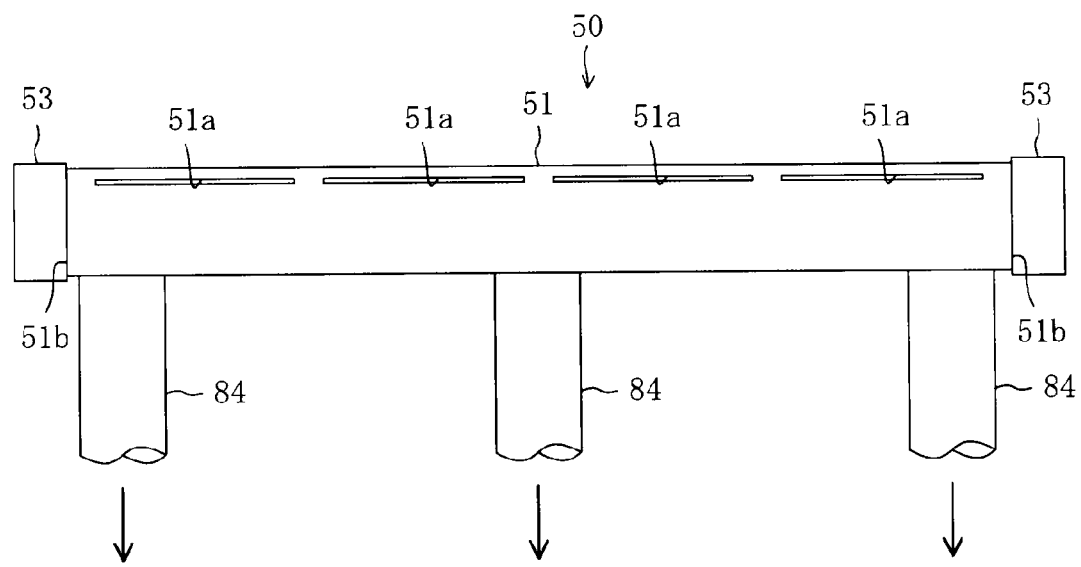
FIG. 9 is a plan view illustrating a configuration in which a plurality of suction pipes are connected to the suction nozzle.

As illustrated in FIG. 9, a plurality of suction pipes 84 (three suction pipes 84 in FIG. 9) may be connected to the suction nozzle 51 so as to be arranged at regular intervals in the axial direction of the suction nozzle 51. Such a configuration reduces non-uniform suction power caused depending on a portion of the suction nozzle 51 in the axial direction thereof, thereby maintaining the suction power constant.

Note that a configuration may be employed, in which the suction pipe 84 is connected to each of the end portions of the suction nozzle 51.

Figure 10:
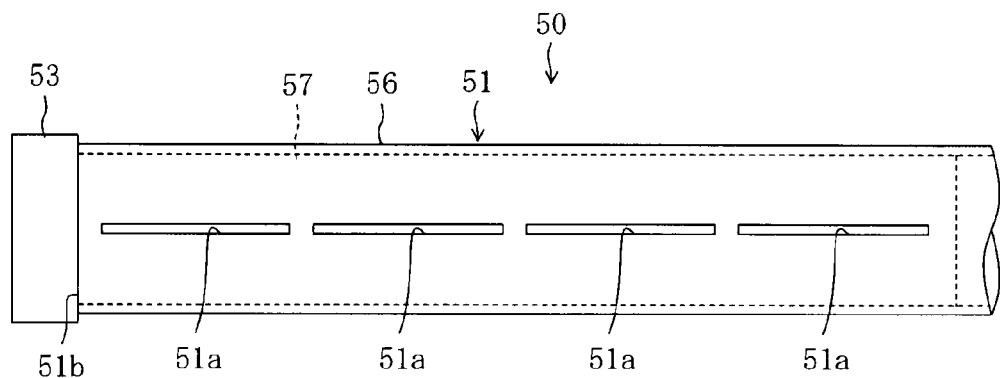
FIG. 10 is a plan view illustrating a configuration of an outer nozzle cylinder of the suction nozzle.

As illustrated in FIG. 10, the suction nozzle 51 may have a double pipe structure including an outer nozzle cylinder 56 in which inlet holes 51a are formed, and an inner nozzle cylinder 57 rotatably fitted into the outer nozzle cylinder 56 along an inner circumferential surface thereof.

Figure 11:
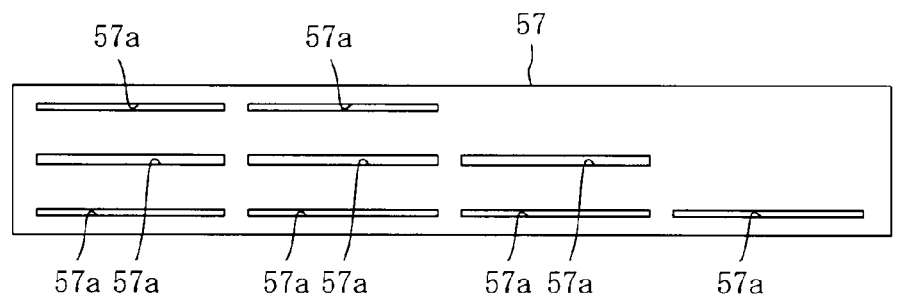
FIG. 11 is a plan view illustrating a configuration of an inner nozzle cylinder of the suction nozzle.

In the outer nozzle cylinder 56, the slit-shaped inlet holes 51a (four inlet holes 51a in the example illustrated in FIG. 10) are formed so as to be spaced from each other in an axial direction of the outer nozzle cylinder 56. As illustrated in FIG. 11, in the inner nozzle cylinder 57, rows each including slit-shaped communication holes 57a (three rows in the example illustrated in FIG. 11) are formed so as to be spaced from each other in a circumferential direction of the inner nozzle cylinder 57. In each of the rows, a plurality of communication holes 57a are formed so as to be spaced from each other in the axial direction of the inner nozzle cylinder 57. Specifically, in the example illustrated in FIG. 11, two communication holes 57a are formed in a first row from above, three communication holes 57a are formed in a second row from above, and four communication holes 57a are formed in a third row from above.

Figure 12A:
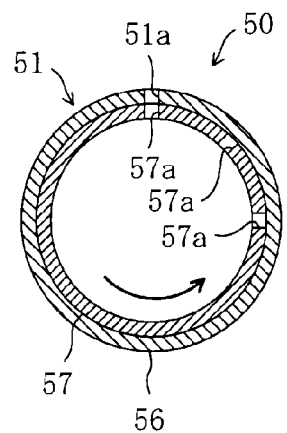
FIGS. 12A, 12B, and 12C are cross-sectional views illustrating an opening/closing state of the inlet holes of the suction nozzle.
Figure 12B:
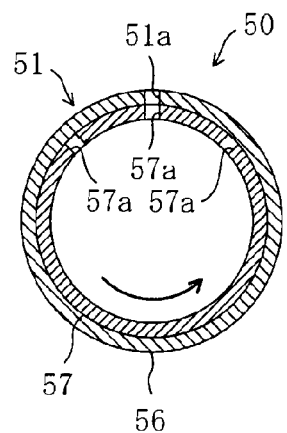
Figure 12C:
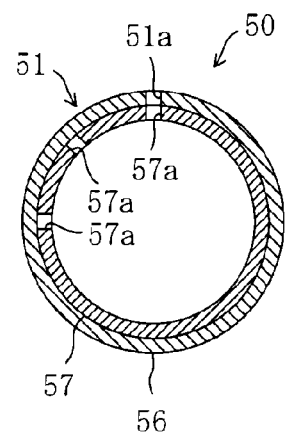

FIGS. 12A, 12B, and 12C are cross-sectional views illustrating an opening/closing state of the inlet hole of the suction nozzle. FIG. 12A illustrates a state in which the communication holes 57a of the first row of the inner nozzle cylinder 57 are communicated with the inlet holes 51a. In such a state, the first and second inlet holes 51a from left as viewed in FIG. 10 are communicated with the communication holes 57a and are opened. On the other hand, the remaining two inlet holes 51a are closed by the inner nozzle cylinder 57.

FIG. 12B illustrates a state in which the communication holes 57a of the second row of the inner nozzle cylinder 57 are communicated with the inlet holes 51a. In such a state, the first, second, and third inlet holes 51a from left as viewed in FIG. 10 are communicated with the communication holes 57a and are opened. On the other hand, the remaining one inlet hole 51a is closed by the inner nozzle cylinder 57.

FIG. 12C illustrates a state in which the communication holes 57a of the third row of the inner nozzle cylinder 57 are communicated with the inlet holes 51a. In such a state, all of the inlet holes 51a are communicated with the communication holes 57a and are opened.

In such a configuration, the inner nozzle cylinder 57 rotates, and the inlet holes 51a and the communication holes 57a are selectively communicated with each other depending on a rotational angle of the inner nozzle cylinder 57. In such a manner, the selected inlet holes 51a can be opened/closed. As a result, the inlet holes 51a which do not contribute to the suction and removal of the liquid medium can be closed depending on the width of the wiping sheet S, thereby improving the suction efficiency.

After fibers of the wiping sheet S are sucked, even if some fibers are caught at a rim of the inlet hole 51a, the fibers can be easily removed by rotating the inner nozzle cylinder 57. Note that the number, shape, and arrangement of the inlet hole 51a and the communication hole 57a have been set forth merely for purposes of examples in nature, and the present disclosure is not limited to such a configuration.

As illustrated in FIG. 1, a heating device 58 is connected to the suction nozzle 51. The heating device 58 is configured to heat a surface of the suction nozzle 51, along which the wiping sheet S is guided, and is, e.g., a heater. In such a configuration, the suction nozzle 51 sucks and removes the liquid medium, and functions as a so-called "smoothing iron" to smooth the wiping sheet S with heat by pressing the surface of the wiping sheet S against the heated surface of the suction nozzle 51. Thus, drying of the liquid medium can be accelerated, and the lint on the surface of the wiping sheet S can be removed.

An outlet end of the separation pipe 88 is connected to the storage tank 80, and the liquid medium stored in the storage tank 41 is discharged to the storage tank 80 through the separation pipe 88.

The separation tank 85 is configured to separate the liquid medium and the adhered substance P sucked through the suction nozzle 51. Specifically, when the liquid medium containing the adhered substance P flows into the separation tank 85, the liquid medium is discharged to the storage tank 80 through the separation pipe 88, and the adhered substance P is accumulated on a bottom plate of the separation tank 85. The separation tank 85 has a structure in which the separation tank 85 can be tilted toward a front side of the adhered substance removing device 10 about a rotary shaft which is not shown in the figure. The adhered substance P accumulated on the bottom plate of the separation tank 85 can be removed in a state in which the operator tilts the separation tank 85 toward the front side of the adhered substance removing device 10, thereby improving the workability.

A silencing muffler 87 with a filter function is connected to the discharge duct 86. The silencing muffler 87 cancels air suction sound to reduce or prevent noise, and blocks the particles of the adhered substance P sucked together with the liquid medium from being discharged to an external environment through the discharge duct 86. In the example illustrated in FIG. 1, the silencing muffler 87 is installed upstream the suction pump 52, but may be installed downstream the suction pump 52.

The wiping sheet S dried in the suction removal unit 50 is upwardly guided from below a direction changing roller 55 attached to the main body cover 15 along an outer circumferential surface of the direction changing roller 55, and then is wounded into the roll by the downstream roller 60. The downstream roller 60 is connected to the drive motor which is not shown in the figure, and winds the wiping sheet S drawn from the upstream roller 20 in conjunction with rotation of the drive motor. In a narrow sense, the wiping sheet S is wounded into the roll around a cylindrical core fitted onto a roller shaft of the downstream roller 60. In such a manner, only by detaching the core from the downstream roller 60, the roll of the wiping sheet S can be delivered to a wiping device in which another process is performed.

Figure 13:
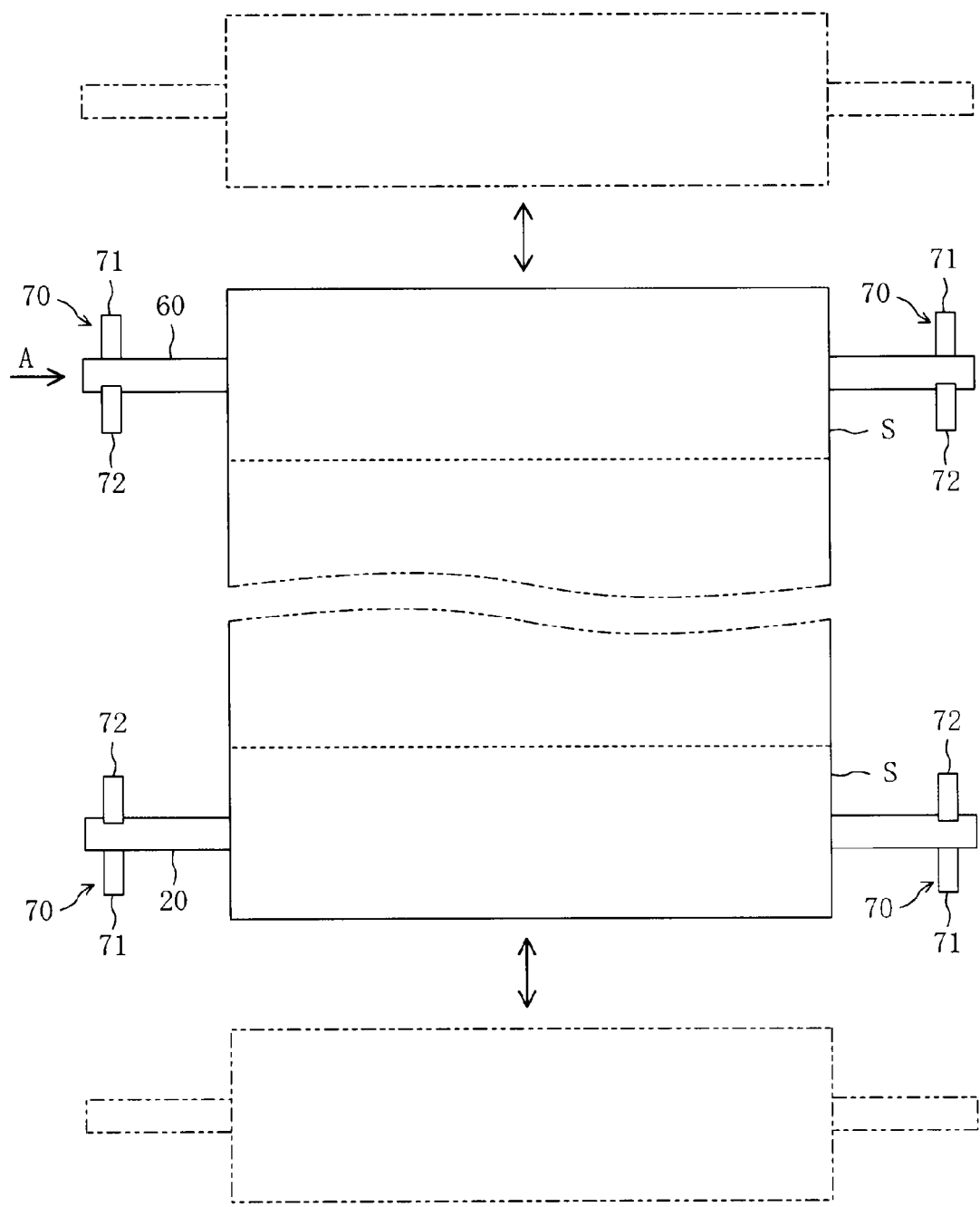
FIG. 13 is a plan view illustrating a configuration of a bearing member.
Figure 14:
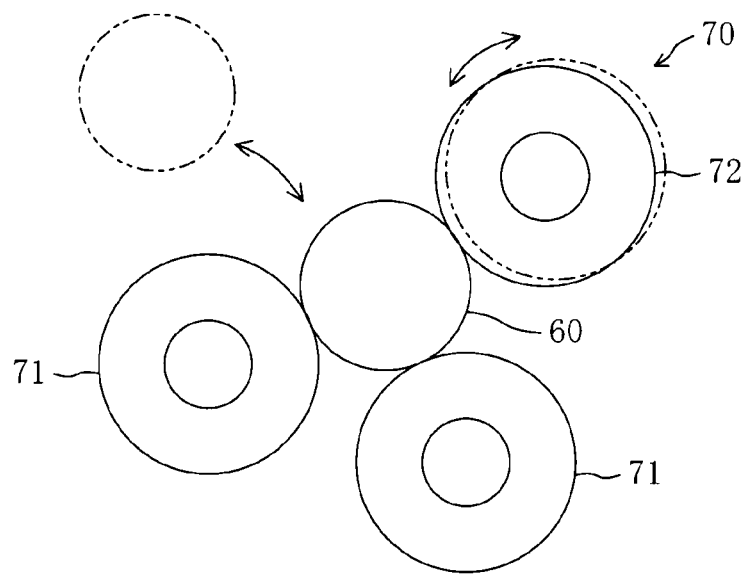
FIG. 14 is a perspective view of the bearing member of FIG. 13 as viewed from a side indicated by an arrow A.

FIG. 13 is a plan view illustrating a configuration of the bearing member, and FIG. 14 is a perspective view of the bearing member of FIG. 13 as viewed from a side indicated by an arrow A. As illustrated in FIGS. 13 and 14, the downstream roller 60 is rotatably supported by bearing members 70 at both ends of the roller shaft of the downstream roller 60. Specifically, the bearing member 70 includes two support rollers 71 configured to support the roller shaft, and a biased roller 72 biased in a direction in which the roller shaft is pressed. The three rollers rotatably support the roller shaft of the downstream roller 60.

When the operator attaches the downstream roller 60 to the bearing member 70, the roller shaft is pushed into the bearing member 70 from the downstream side in the delivery direction of the wiping sheet S against biasing force of the biased roller 72, thereby sandwiching the downstream roller 60 between each of the support rollers 71 and the biased roller 72. On the other hand, when the downstream roller 60 is detached from the bearing member 70, the roller shaft is pulled out from the bearing member 70 toward the downstream side in the delivery direction of the wiping sheet S against the biasing force of the biased roller 72, thereby detaching the downstream roller 60.

As in the bearing member 70 supporting the downstream roller 60, the bearing member 70 supporting the upstream roller 20 includes two support rollers 71 and a single biased roller 72. When the upstream roller 20 is attached to the bearing member 70, the roller shaft of the upstream roller 20 is pushed into the bearing member 70 from the upstream side in the delivery direction of the wiping sheet S. When the upstream roller 20 is detached from the bearing member 70, the roller shaft of the upstream roller 20 is pulled out from the bearing member 70 toward the upstream side in the delivery direction of the wiping sheet S.

Separating Operation of Adhered Substance

Next, a sequence of an operation for separating the adhered substance P adhered to the wiping sheet S by the adhered substance removing device 10 will be described.

First, as illustrated in FIG. 1, the main body cover 15 is opened, the wiping sheet S wounded into the roll after wiping off of the adhered substance P is attached to the upstream roller 20, and the upstream roller 20 is loaded in the bearing members 70 (see FIG. 13). Then, the wiping sheet S is drawn from the upstream roller 20. The wiping sheet S passes above the suction nozzle 51 of the suction removal unit 50, and is wounded around the downstream roller 60. Subsequently, the main body cover 15 is closed, and the wiping sheet S is guided along the curved surface of the oscillation box 45 of the oscillation unit 40, the position adjustment roller 26, the suction nozzle 51 of the suction removal unit 50, and the direction changing roller 55. In such a state, the roller shaft of the upstream roller 20 is pressed by the rotation restriction member 22, and the rotation of the upstream roller 20 is restricted.

Next, the drive motor which is not shown in the figure is driven to rotatably drive the downstream roller 60, and the wiping sheet S is wounded around the downstream roller 60. When the predetermined tensile force is provided to the wiping sheet S between the upstream roller 20 and the downstream roller 60, the pressing of the wiping sheet S by the rotation restriction member 22 is canceled, and the rotation of the upstream roller 20 is allowed. Then, the delivery of the wiping sheet S is started.

Next, the liquid medium is supplied to the wiping sheet S through the supply pipe 31 of the liquid supply unit 30. While the wiping sheet S is impregnated with the liquid medium supplied to the wiping sheet S, the liquid medium which is not absorbed by the wiping sheet S and is leaked from the surface of the wiping sheet S is stored in the storage tank 41.

The ultrasonic oscillators 46 of the oscillation unit 40 produce oscillation, and the oscillation is transmitted to the wiping sheet S and the adhered substance P through the liquid medium with which the wiping sheet S is impregnated. In such a state, due to the transmission velocity difference between the oscillation transmitted to the wiping sheet S and the oscillation transmitted to the adhered substance P, the amplitude variation is caused therebetween. That is, the adhered substance P intensively oscillates as compared to the wiping sheet S, thereby separating the adhered substance P from the surface of the wiping sheet S.

A part of the particles of the separated adhered substance P is accumulated on the bottom plate of the storage tank 41 through the holes of the perforated metal 42, and the remaining particles of the adhered substance P are accumulated on the upper surface of the perforated metal 42. However, since the perforated metal 42 functions as a reflector which reflects the oscillation of the ultrasonic oscillators 46, the remaining particles of the adhered substance P accumulated on the surface of the perforated metal 42 drop through the holes of the perforated metal 42 by oscillation of the perforated metal 42 and are accumulated on the bottom plate of the storage tank 41. This reduces the re-adhering of the adhered substance P to the surface of the wiping sheet S during the delivery thereof.

Next, the wiping sheet S from which the adhered substance P is removed in the oscillation unit 40 is delivered to the suction removal unit 50. In the suction removal unit 50, air is sucked from the suction nozzle 51 to suck and remove the liquid medium with which the wiping sheet S is impregnated and the adhered substance P re-adhered to the surface of the wiping sheet S.

The wiping sheet S dried in the suction removal unit 50 is wounded into the roll around the downstream roller 60. The followings are successively performed: the removal of the adhered substance P, the drying of the wiping sheet S, and the winding of the wiping sheet S. When the roll inner end detection sensor 28 arranged near downstream of the upstream roller 20 detects the inner end of the roll of the wiping sheet S, the separation of the adhered substance P by the oscillation unit 40 is terminated. When the wiping sheet S is completely wounded around the downstream roller 60, the operation is completed.

As illustrated in FIG. 13, the operator pulls out and detaches the roller shaft of the downstream roller 60 from the bearing members 70 against the biasing force of the biased roller 72 of the bearing member 70, and the roll of the wiping sheet S wounded around the downstream roller 60 is detached. In such a manner, the roll of the wiping sheet S from which the adhered substance P is removed is loaded in the wiping device in which another process is performed, and then is reused.

As described above, according to the adhered substance removing device 10 of the present example embodiment, the wiping sheet S wounded into the roll is drawn and delivered toward the downstream side in the delivery direction of the wiping sheet S, the liquid medium is supplied to the wiping sheet S in the liquid supply unit 30, and the oscillation of the ultrasonic oscillators 46 is transmitted to the wiping sheet S and the adhered substance P through the liquid medium with which the wiping sheet S is impregnated. Thus, the adhered substance P adhered to the wiping sheet S can be separated by the amplitude variation caused due to the transmission velocity difference between the oscillation transmitted to the wiping sheet S and the oscillation transmitted to the adhered substance P. As a result, the wiping sheet S used for wiping off the adhered substance P can be reused several times. In addition, it is not necessary to dispose the wiping sheet S, and therefore the reuse of the wiping sheet S is advantageous to the cost reduction.

Since the lid 53 is detachably attached to the opening 51b of the suction nozzle 51, the operator can detach the lid 53 to regularly check whether or not the suction nozzle 51 is clogged with the adhered substance P and fibers, and the adhered substance P and the fibers can be easily removed by using, e.g., the long brush.

In the present example embodiment, the case has been described, in which the adhered substance removing device 10 is used to remove the adhered substance P from the wiping sheet S used for wiping off the adhered substance P such as solder, which spreads over the surface of the metal mask. However, the present disclosure is not limited to such a configuration using the wiping sheet S.

For example, under an environment under which a spray fluxer in which flux is sprayed and applied to a printed circuit board, a reflow device in which a chip is bonded to a printed circuit board by heating and melting cream solder applied to the printed circuit board in advance with infrared light, etc. are operated, a long sheet-like filter provided at an outlet port in order to collect a flux component, soot, dust, etc. flowing in air may be loaded in the adhered substance removing device 10 of the present disclosure, and the filter may be reused after substance adhered to the filter is removed.

As described above, in the present disclosure, the highly-practical advantage can be realized, in which the adhered substance removing device in which the adhered substance is removed from the wiping sheet used for wiping off the adhered substance such as solder, which spreads over the surface of the metal mask, and the wiping sheet can be reused several times can be provided. Thus, the present disclosure is extremely useful, and industrial applicability thereof is high.

What is claimed is:

1. A device for removing adhered substances from a long wiping sheet wounded into a roll after the wiping sheet is used for wiping off the adhere substances, comprising:
   an upstream roller configured to rotatably support the wiping sheet wounded into the roll;
   a downstream roller configured to rewind the wiping sheet drawn from the upstream roller into a roll while delivering the wiping sheet to a downstream side in a delivery direction of the wiping sheet;
   a liquid supply unit arranged between the upstream and downstream rollers and configured to supply a liquid medium to the wiping sheet as an oscillation transmission medium;
   a storage tank configured to store the liquid medium supplied from the liquid supply unit;
   an oscillation unit arranged above the storage tank and including an ultrasonic oscillator providing oscillation to the liquid medium with which the wiping sheet is impregnated; and
   a suction removal unit arranged downstream the oscillation unit and configured to suck and remove the liquid medium with which the wiping sheet is impregnated and the adhered substances separated from the wiping sheet by the oscillation unit and re-adhered to a surface of the wiping sheet,
   wherein the suction removal unit includes
      a cylindrical suction nozzle extending in a width direction of the wiping sheet and having an inlet hole in a surface along which the wiping sheet is guided,
      a lid detachably attached so as to close an opening at least one end of the suction nozzle, and
      a suction pump configured to suck air from the suction nozzle.

2. The device of claim 1, wherein
a plurality of slit-shaped inlet holes extending in an axial direction of the suction nozzle are formed so as to be spaced from each other in the axial direction, and
the suction nozzle further includes a closing member configured to close the inlet hole opening in an outer position of the suction nozzle relative to an end of the wiping sheet guided along the suction nozzle in the width direction thereof.

3. The device of claim 1, wherein
a plurality of slit-shaped inlet holes extending in a circumferential direction of the suction nozzle so as to be inclined to the delivery direction of the wiping sheet are formed so as to be spaced from each other in the axial direction of the suction nozzle.

4. The device of claim 1, wherein
the suction nozzle further includes an outer nozzle cylinder having the inlet hole, and an inner nozzle cylinder rotatably fitted into the outer nozzle cylinder along an inner circumferential surface thereof, and
in the inner nozzle cylinder, a plurality of communication holes selectively opening/closing the inlet hole depending on a rotational angle of the inner nozzle cylinder are formed so as to be spaced from each other in a circumferential direction of the inner nozzle cylinder.

5. The device of claim 1, further comprising:
a heating unit configured to heat a surface of the suction nozzle, along which the wiping sheet is guided.

6. The device of claim 1, wherein
a bottom plate of the storage tank is downwardly inclined from an upstream side to a downstream side in the delivery direction of the wiping sheet.

7. The device of claim 1, wherein
a perforated metal is arranged so as to face the bottom plate of the storage tank with a predetermined clearance in the storage tank.

8. The device of claim 1, further comprising:
a position adjustment roller arranged between the oscillation unit and the suction removal unit and configured to adjust a height of the wiping sheet relative to the oscillation unit,
wherein the oscillation unit and the position adjustment roller are movable in synchronization with each other between a position in which the oscillation unit faces the storage tank and a position in which the oscillation unit is apart from the storage tank.

9. The device of claim 1, further comprising:
a rotation restriction unit configured to restrict rotation of the upstream roller after winding of the wiping sheet around the downstream roller is started and before predetermined tensile force is provided to the wiping sheet stretched between the upstream roller and the downstream roller.

10. The device of claim 1, wherein
the oscillation unit includes a plurality of ultrasonic oscillators, and
each of the plurality of ultrasonic oscillators is independently switchable between an operated state and a stopped state.

* * * * *